United States Patent [19]
Jack et al.

[11] Patent Number: 5,808,350
[45] Date of Patent: Sep. 15, 1998

[54] INTEGRATED IR, VISIBLE AND NIR SENSOR AND METHODS OF FABRICATING SAME

[75] Inventors: Michael D. Jack; Michael Ray, both of Goleta; Richard H. Wyles, Carpinteria, all of Calif.

[73] Assignee: Raytheon Company, Lexington, Mass.

[21] Appl. No.: 778,934

[22] Filed: Jan. 3, 1997

[51] Int. Cl.$^6$ .................. H01L 31/0256; H01L 31/0232; H01L 27/148
[52] U.S. Cl. .......................... 257/440; 257/184; 257/188; 257/228; 257/432; 257/438; 257/442; 257/447
[58] Field of Search ................................. 257/183.1, 184, 257/186, 188, 228, 432, 438, 440, 442, 447

[56] References Cited

U.S. PATENT DOCUMENTS

| | | | |
|---|---|---|---|
| 4,213,137 | 7/1980 | Pines | 257/228 |
| 4,257,057 | 3/1981 | Cheung et al. | 257/183.1 |
| 4,258,376 | 3/1981 | Shannon | 257/228 |
| 4,626,675 | 12/1986 | Gundner et al. | 257/440 |
| 5,373,182 | 12/1994 | Norton | 257/440 |
| 5,432,374 | 7/1995 | Norton | 257/442 |
| 5,559,336 | 9/1996 | Kosai et al. | 257/442 |
| 5,567,975 | 10/1996 | Walsh et al. | 257/442 |

OTHER PUBLICATIONS

Leos '95, IEEE Lasers and Electro–Optics Society 1995 Annual Meeting, 8th Annual Meeting, Conference Proceedings (Cat. No. 95CH35739) Part vol. 1, pp. 29–30 vol. 1.
"Low threshold, wafer fused long wavelength vertical cavity lasers", J. J. Dudley et al.,Appl. Phys. Lett. 64, Mar. 21, 1994, pp. 1463–1465.
"Analysis of wafer fusing for 1.3pm vertical cavity surface emitting lasers", R.J. Ram et al, Appl. Phys. Lett. 62, May 17, 1993, pp. 2474–2476.
Electrical characteristics of directly–bonded GaAs and InP, Hiroshi Wada et al., Appl. Phys. Lett. 62, Feb. 15, 1993, pp. 738–740.
Wafer fusion: A novel technique for optoelectronic device fabrication and monolithic integration, Z. L. Liau et al., Appl. Phys. Lett. 56, Feb. 19, 1990, pp. 737–739.
"High Quantum Efficiency and Narrow Absorption Bandwidth of the Wafer–Fused Resonant $In_{0.53}Ga_{0.47}As$ Photodetectors", I–Hsing Tan et al., IEEE Photonics Technology Letters, vol. 6, No. 7, Jul. 1994.
Modeling and Performance of Wafer–Fused Resonant–Cavity Enhanced Photodetectors, I–Hsing Tan et al. IEEE Journal of Quantum Electronics, vol. 31, No. 10, Oct. 1995.

*Primary Examiner*—Gene M. Munson
*Attorney, Agent, or Firm*—W. C. Schubert; G. H. Lenzen, Jr.

[57] ABSTRACT

An imaging device (10) has a plurality of unit cells that contribute to forming an image of a scene. The imaging device includes a layer of semiconductor material (16), for example silicon, that has low noise photogate charge-mode readout circuitry (20, 21, 26, 28) (e.g., CCD or CMOS readout circuitry and structures) that is disposed upon a first surface (18) of the layer. A second, opposing surface of the layer is a radiation admitting surface of the layer. The layer has a bandgap selected for absorbing electromagnetic radiation having wavelengths shorter than about one micrometer and for generating charge carriers from the absorbed radiation. The generated charge carriers are collected by the photogate charge-mode readout circuitry. A thermal sensing element (22) is disposed above and is thermally isolated from the first surface of the layer. The thermal sensing element may be, by example, one of a bolometer element, a pyroelectric element, or a thermopile element. A layer (12) of narrower bandgap semiconductor material can also be employed with this invention, wherein the layer of narrower bandgap semiconductor material (such as InGaAs or HgCdTe) is atomically bonded to the second surface along a heterojunction interface that is continuous or apertured across the second surface. The bonded layer is used to absorb NIR and visible light.

29 Claims, 7 Drawing Sheets

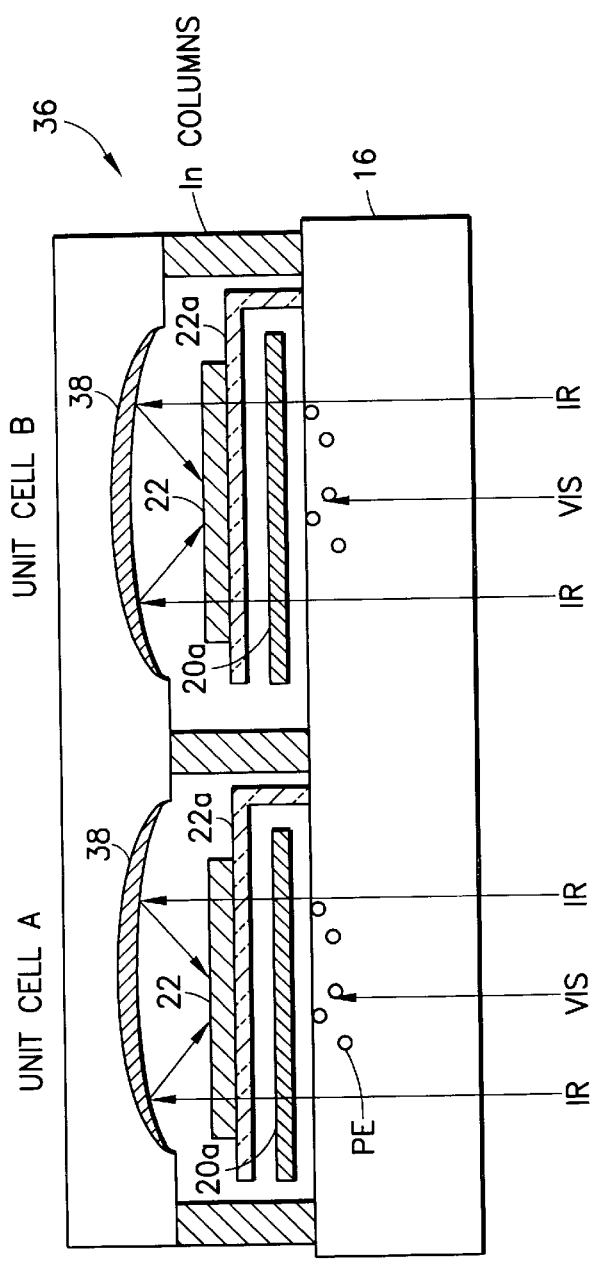
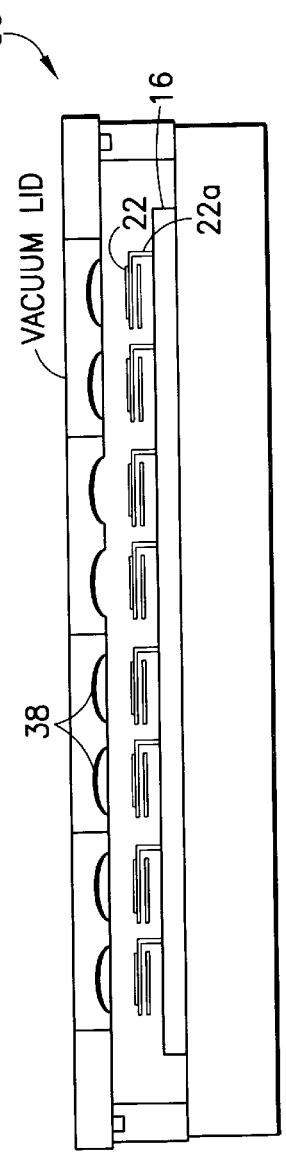

INTEGRATED IR, VISIBLE AND NIR SENSOR AND METHODS OF FABRICATING SAME

FIELD OF THE INVENTION

This invention relates generally to detectors of electromagnetic radiation and, in particular, imaging devices constructed with semiconductor materials and to methods for fabricating same.

BACKGROUND OF THE INVENTION

Image intensifiers and conventional backside illuminated silicon-based charge coupled devices (CCDS) are commonly used as detectors of electromagnetic radiation. However, these conventional devices are limited in wavelength response to, typically, the visible range (i.e., approximately 0.4 micrometers to approximately 0.8 micrometers). More particularly, these conventional detectors are not sensitive to the infrared radiation (IR) range, such as the near-IR (NIR) (i.e., approximately 0.8 micrometers to 1.8 micrometers). This is a distinct disadvantage for many applications, in particular for so-called low light level (LLL) applications, since the night sky is characterized by a significant NIR illumination.

However, conventional CCD detectors do provide the advantage of a relatively simple, low noise read-out structure, wherein the low noise read-out is inherent in the direct collection of charge under an integrating gate. More particularly, conventional CMOS or CCD imagers collect charge carriers directly under a photogate structure, which enables the resetting of each pixel element by a "noiseless" transfer of charge, rather than a conventional voltage mode resetting operation that is employed in conventional IR detectors. Such a charge collection scheme is not possible to implement in conventional hybrid IR Focal Plane Array (FPA) technology, except by direct injection through a transistor. However, the direct injection technique fails at very low light levels where transistor resistances become exceedingly high, with a resulting degradation of injection efficiency.

In an attempt to remedy the wavelength limitations of conventional CCD-based imagers merged visible/IR systems have been proposed or implemented. However, these hybrid systems utilize beam splitters and broadband optics and require two or more sensor chips, each responsive to a separate wavelength band. Furthermore, such hybrid systems require a precise registration of images from both chips, and may thus be subject to vibrational problems. Even a slight (e.g., <5 μm) vibration of the chips due to flexing of an enclosing housing can result in the generation of noise in a composite IR/Visible/NIR image.

Reference can be had to commonly assigned U.S. Pat. No. 5,373,182, entitled "Integrated IR and Visible Detector", by P. R. Norton, and to commonly assigned U.S. Pat. No. 5,432,374, entitled "Integrated IR and MM-Wave Detector", also by P. R. Norton, for teaching integrated radiation detector structures.

OBJECTS OF THE INVENTION

It is a first object of this invention to provide an imager that is responsive to at least two spectral bands (such as the visible/NIR, visible/long wave IR (IWIR), visible/mid wave IR (MWIR), visible/NIR/LWIR, etc.), and that requires but one broadband sensor chip that overcomes the foregoing and other problems.

It is a second object of this invention to provide an imager that is responsive to at least two spectral bands (such as the visible/NIR, visible/LWIR, visible/MWIR, visible/NIR/LWIR, etc.), and that requires but one broadband sensor chip that is constructed using heterojunction atomic bonding techniques to join together dissimilar radiation-responsive semiconductor materials.

It is a further object of this invention to provide an imager that is responsive to at least two spectral bands (such as the visible/NIR, visible/LWIR, visible/MWIR, visible/NIR/LWIR, etc.), and that employs a low noise readout circuit such as may be utilized in a CCD or CMOS circuit. The LLL visible/NIR imager preferably utilizes a charge mode architecture for collection and transfer in the charge domain, thus avoiding reset noise generated by resetting capacitors for circuits that operate in a voltage mode, and thus enabling detection down to the few electron level. While the thermal LWIR sensor portion of the integrated imager preferably utilizes readout designs for voltage or current mode circuits which monitor the effective resistance (for bolometric sensors); it is within the scope of the teaching of this invention to also employ a change in voltage on a capacitor (for pyroelectric sensors); or a change in voltage on a bimetal junction (for thermopile-based sensors).

SUMMARY OF THE INVENTION

A multispectral imager includes a low cost, monolithic silicon-based sensor to simultaneously (or sequentially) detect LWIR (uncooled), visible and NIR radiation at low light levels. Integrated optical elements can-be employed to simultaneously concentrate both the IR and visible/NIR radiation onto the respective detective elements within a unit cell, thereby enhancing the performance of the multispectral imager.

In accordance with this invention there is provided an imaging device having a plurality of unit cells that contribute to forming an image of a scene. The imaging device includes a layer of semiconductor material, for example silicon, that has low noise photogate charge-mode readout circuitry or, alternatively, voltage-mode readout circuitry. In the latter the photogenerated charge produced in the silicon or NIR layer may be collected on a diode (produced by an N+ diffusion into silicon), with the resulting voltage being readout and the diffusion reset. This latter implementation may enable response to larger signals without saturation.

A second, opposing surface of the layer is a radiation admitting surface of the layer. The layer has a bandgap selected for absorbing electromagnetic radiation having wavelengths shorter than about one micrometer and for generating charge carriers from the absorbed radiation. The generated charge carriers are collected by the photogate charge-mode readout circuitry. The imaging device further includes a thermal sensing element that is disposed above and that is thermally isolated from the first surface of the layer. The thermal sensing element may be, by example, one of a bolometer element, a pyroelectric element, or a thermopile element.

A plurality of thermal reflectors can be provided, wherein individual ones of the thermal reflectors are disposed above the first surface for concentrating incident thermal radiation, that passes through the layer, onto the thermal sensing element. An array of microlenses can also be provided, the array being disposed relative to the radiation admitting surface for focussing onto the layer any incident electromagnetic radiation having wavelengths shorter than about one micrometer, and for focussing onto the thermal sensing element and electromagnetic radiation having wavelengths longer than about one micrometer.

A layer of narrower bandgap semiconductor material can also be employed with this invention. In this embodiment the layer of narrower bandgap semiconductor material (such as InGaAs or HgCdTe) is atomically bonded to the second surface along a heterojunction interface that is continuous or apertured across the second surface. The bonded layer is used to absorb NIR and visible light, and the resulting charge carriers are transported across the heterojunction interface to be collected by the low noise photogates. For the apertured case, the layer of narrower bandgap semiconductor material has a plurality of openings formed therein in registration with selected ones of the unit cells for admitting electromagnetic radiation, having it wavelengths less than about one micrometer, into the selected ones of the unit cells.

Also disclosed is a monolithic visible/LWIR or MWIR/NIR sensor array that includes a substrate having an atomically bonded, narrower bandgap layer on a first, radiation-receiving surface; and a plurality of detector sites disposed on a second, opposite surface of the substrate. Each of said sites includes readout circuitry; a MWIR or LWIR-responsive detector disposed over the second surface of the substrate; and a plurality (e.g., four) visible/NIR detectors interposed between the MWIR or LWIR detector and the second surface.

BRIEF DESCRIPTION OF THE DRAWINGS

FIG. 1b iis a more detailed cross-sectional view of the LWIR silicon microbolometer cell (SMC) of FIG. 1a;

FIG. 4a is an enlarged, cross-sectional view of an integrated imager that employs optical enhancement using a shaped reflective optical element as an optical concentrator;

FIG. 4b illustrates an embodiment wherein the shaped reflector elements are incorporated into a vacuum lid of a package that encloses the imager;

DETAILED DESCRIPTION OF THE INVENTION

Figure 1A:
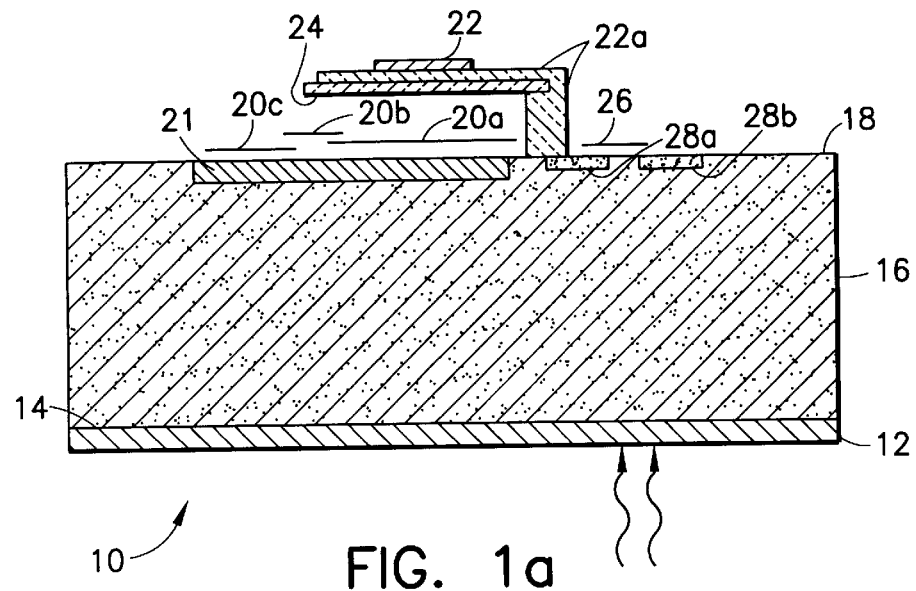
FIG. 1a is simplified enlarged, cross-sectional view of an integrated LWIR/VIS/NIR imager that utilizes a silicon microbolometer cell (SMC) and current sampling readout and a CCD photogate and CCD column readout to achieve low noise operation.

FIG. 1a illustrates a backside illuminated, CCD embodiment of a heterojunction bonded LWIR/VIS/NIR imager 10.

The imager 10 includes a NIR-responsive detecting layer 12, a heterojunction atomic bonding layer or interface 14, and a silicon (or InP or GaAs) layer 16. By example, and for a Group III–V embodiment, the detecting layer 12 may be comprised of InP, GaAs or InGaAs. Further by example, and for a Group II–VI embodiment, the detecting layer 12 may be comprised of HgCdTe. A suitable thickness for the detecting layer 12 is in the range of about one to ten micrometers, the actual thickness being a function at least in part of the IR wavelength band that is desired to be detected, while ten micrometers is a suitable thickness for the silicon layer 16. Although not illustrated in FIG. 1a, the NIR detecting layer may be provided on a surface of a transparent (at the wavelengths of interest) substrate, upon which the NIR detecting layer 12 has been previously epitaxially grown. The transparent substrate may be retained, or subsequently removed after the detecting layer 12 is atomically bonded to the silicon layer 16.

Figure 3:
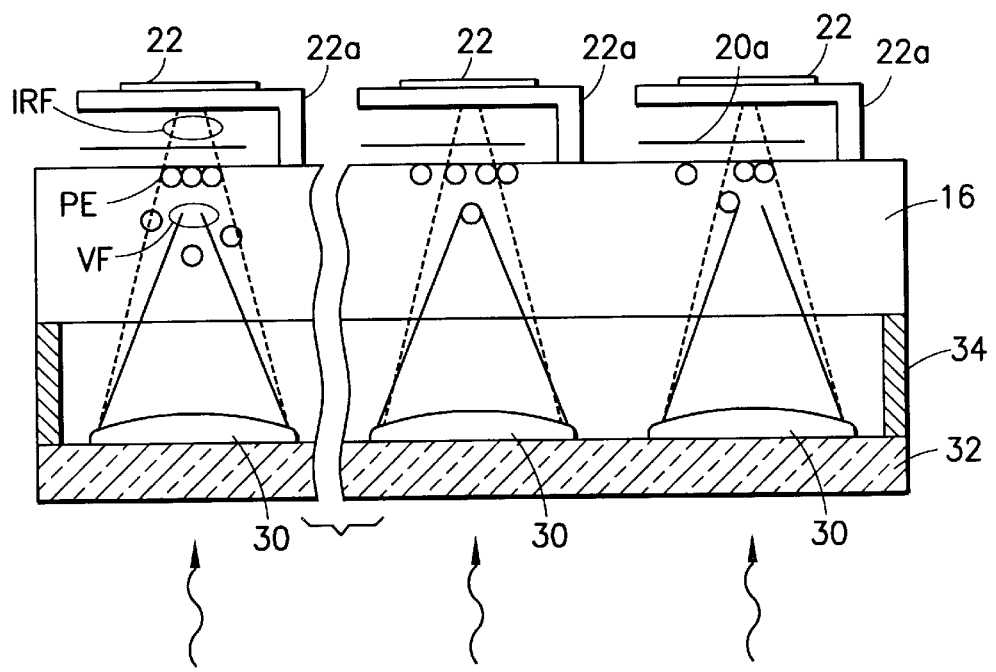
FIG. 3 is an enlarged, cross-sectional view of an integrated LWIR/VIS/NIR imager that employs optical enhancement using a microlens array that is optimized for high transmission and focusing both LWIR and VIS/NIR radiation within the sensor.

It should further be realized that the use of the NIR detecting layer 12 (and atomic bonding interface 14) is optional (see, for example, FIGS. 3 and 4).

The top surface 18 of the silicon layer 16, in this embodiment of this invention, is processed and patterned into a low noise CCD read-out structure and a bolometer readout (current or voltage mode). The CCD read-out structure includes photogate metalization 20a, under which charge carriers are collected, and transfer gate metalization 20b, which transfers the collected charge carriers to a column register 20c which then routes the collected charge to amplifying circuitry of known construction. Each photogate 20a can be considered to define one pixel or unit cell of the imager 10.

More particularly, in FIG. 1a a buried channel (21) CCD implementation is depicted wherein photo-induced charge is transferred by applying a large positive potential to the transfer gate 20b for moving the charge from the photogate 20a to the receiving phase (electrode 20c) of the column CCD. The bolometer readout (current mode) employs a voltage bias and single switching transistor which when on enables current to flow from the bias supply through the bolometer and to be sampled and integrated by a column CTIA (capacitive transimpedance amplifier).

Visible and IR radiation, such as NIR and LWIR radiation, are incident on the backside of the imager 10 and pass substantially unabsorbed through the substrate (if present). In the illustrated embodiment the NIR and visible radiation is absorbed in the narrower bandgap detecting layer 12. The LWIR (and/or MWIR) radiation is absorbed by a bolometer element 22 which is spaced away from the surface 18 by a thermal isolation bridge or spacer 22a. The bridge 22a may include a layer of thermal isolation material 24. In other embodiments of the invention the bolometer element 22 may be replaced by a pyroelectric element or by a thermopile element, or by any suitable thermal sensing element.

Photoinduced charge carriers from the visible/NIR detecting layer 12 pass through the thin atomic bonding interface layer 14, and are swept by an electric field to respective ones of the photogates 20a for collection and integration. The collected charge is then subsequently transferred out of the photogates 20a by the associated transfer gates 20b. Gate 28a represents a current sampling disposed over a column output diffusion 28b. LWIR and/or MWIR radiation heats the thermally isolated thermal detector causing a change in its temperature. This temperature change in turn causes a change in the electrical characteristics of the sensing element; resistance, charge, or Seebeck voltage for bolometric, pyroelectric, and thermopile sensing elements, respectively.

For the bolometer the change in the resistance is typically read as a change in the current for a constant voltage bias. This LWIR-induced current change can be read-out simultaneously with the charge from the photogate 20a, or sequentially therewith.

If used, the atomic bonding of the NIR detecting layer 12 is preferably accomplished after the processing of the low noise silicon circuits, i.e., CMOS or CCD, that are employed for collection, amplification and multiplexing of the photogenerated charge carriers.

The atomic bonding layer 14 enables the two dissimilar semiconductor material types (e.g., silicon and HgCdTe or InGaAs) to be physically and electrically coupled together, while compensating for lattice and energy bandgap mismatches between the two dissimilar semiconductor materials. The use of atomic bonding to join dissimilar semiconductor materials for constructing optical detectors and sources is known in the art, as evidenced by, for example, the following publications: L. H. Tan et al., "High quantum efficiency and narrow absorption bandwidth of the wafer-fused resonant $In_{0.53}Ga_{0.47}As$ photodetectors", IEEE Photon. Technol. Lett., vol. 6, pp. 811–813, 1994; Z. L. Liau, et al., "Wafer fusion: A novel technique for optoelectronic device fabrication and integration," Appl. Phys. Lett., vol. 56, pp. 737–739, 1990; H. Wada, et al. "Electrical characteristics of directly-bonded GaAs and InP," Appl. Phys. Lett., vol. 62, pp. 738–740, 1993; R. J. Ram, et al., "Analysis of wafer fusing for 1.3 $\mu$m vertical cavity surface emitting lasers," Appl. Phys. Lett., vol. 62, pp. 2474–2476, 1993; J. J. Dudley, et al., "Low threshold, wafer fused long wavelength vertical cavity lasers," Appl. Phys. Lett., vol. 64, pp. 1–3, 1994; and I. H. Tan, et al., "Modeling and performance of wafer-fused resonant-cavity enhanced photodetectors," IEEE J. Quantum Electron., vol. 31, pp. 1863–1875, 1995.

Figure 5:
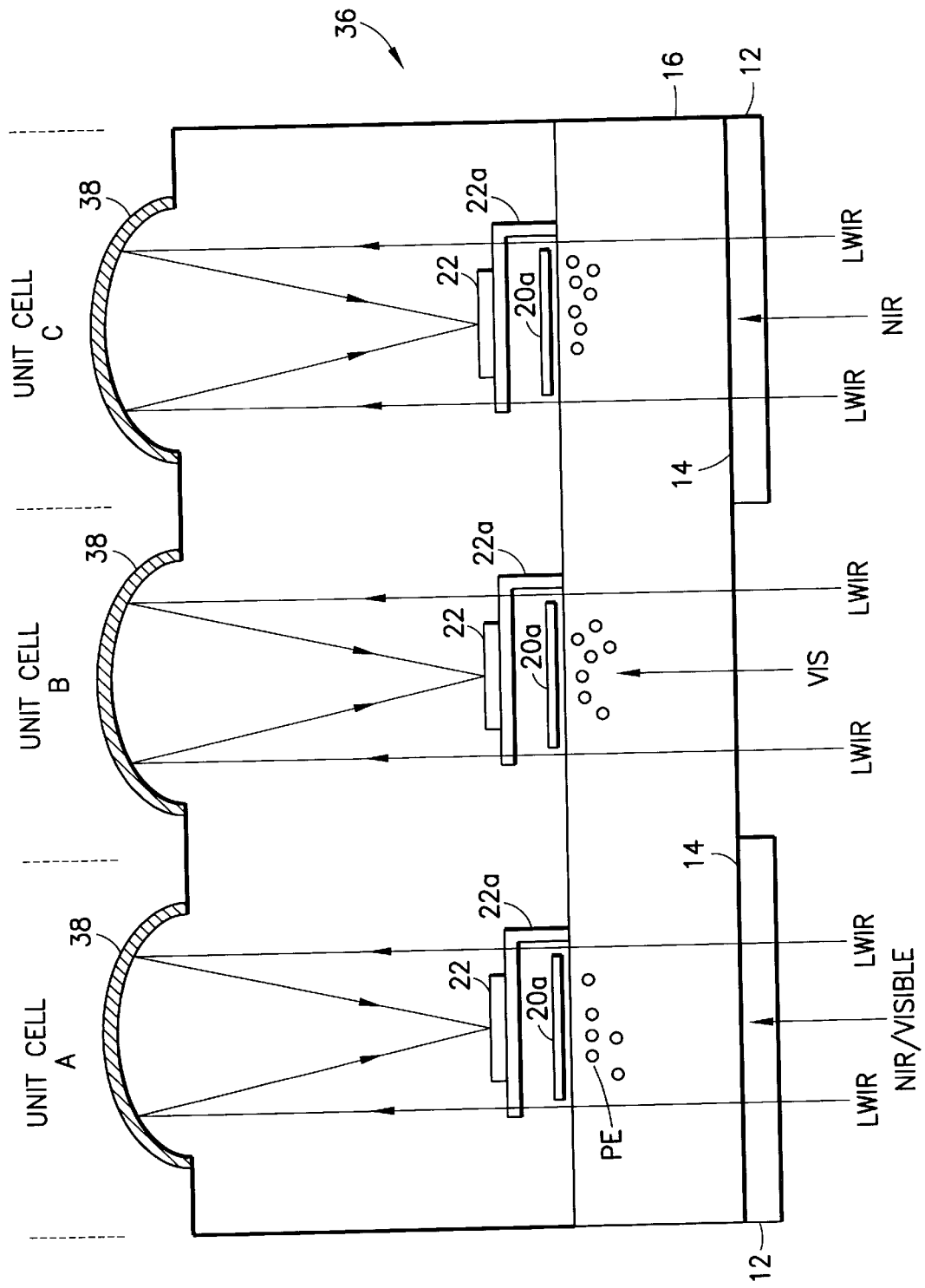
FIG. 5 is an enlarged, cross-sectional view of a three color LWIR/Visible/NIR imager, wherein color separation is achieved by selective etching of an atomically bonded NIR absorbing layer to provide an apertured layer.

In the embodiment of FIG. 1a any MWIR and LWIR radiation passes through the silicon layer 16 substantially unattenuated. Since the photogate 20a which collects photoelectrons generated by the visible and/or NIR radiation can be held at a DC bias, the polysilicon photogate doping is preferably adjusted so that free carrier absorption of the LWIR radiation is small (e.g., <5%). The essentially unattenuated LWIR (or MWIR radiation) thus impinges on the thermal detecting material of element 22 (i.e., bolometer, pyroelectric or thermopile). A shaped reflector, as shown in FIGS. 4a, 4b, and 5, may be used to provide multiple passes of the LWIR while also concentrating the LWIR radiation onto the element 22.

Figure 1B:
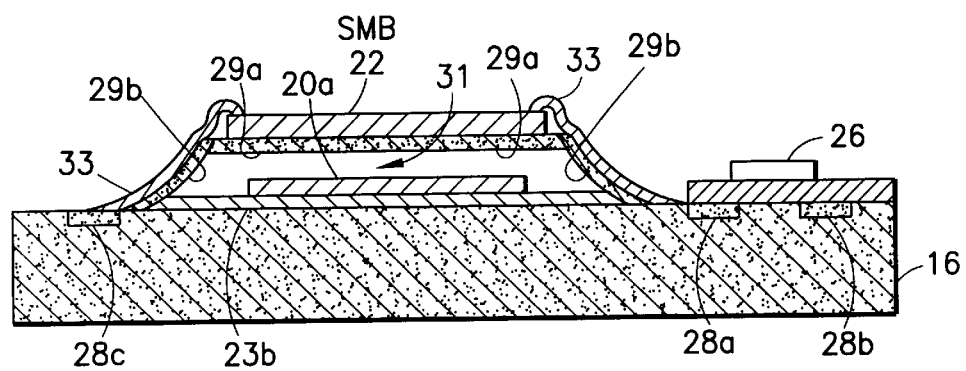
Figure 1C:
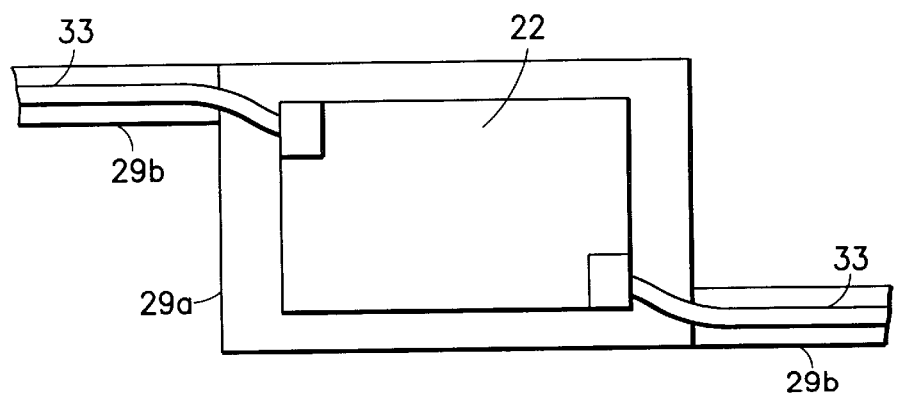
FIG. 1c is a top view of the SMC of FIG. 1b.

FIG. 1b illustrates, in cross-section, the LWIR silicon microbolometer cell (SMC) in greater detail, while FIG. 1c is a top view of same. Diffusion 28c is a voltage bias diffusion, structures 29a and 29b a silicon nitride bridge and bridge legs, respectively, the region 31 is region of undercut that provides a space (e.g., approximately 2–10 microns) beneath the bridge 29a and the overlying $VO_2$ microbolometer element 22, and metalization 33 provides low thermal conductivity SMC electrical contacts. The photogate 20a is shown disposed above an oxide layer 23b.

Figure 2:
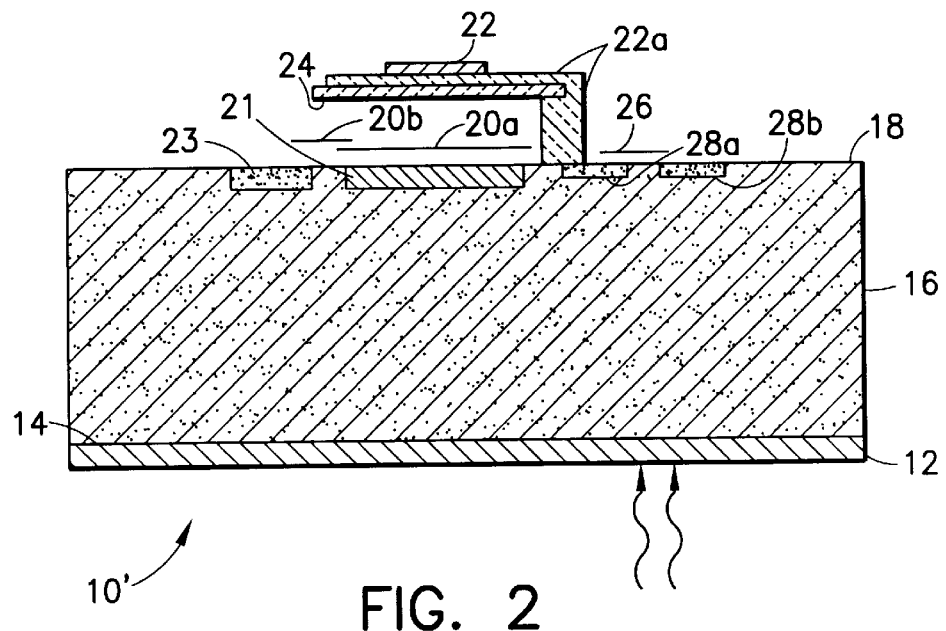
FIG. 2 is an enlarged, cross-sectional view of an integrated LWIR/VIS/NIR imager that utilizes a CMOS column readout to achieve low noise operation.

FIG. 2 is similar to the embodiment of FIG. 1a, and illustrates an imager 10' implemented with low noise CMOS readout technology instead of the low noise CCD readout technology of FIG. 1. In this embodiment a visible/NIR column output diffusion 23 is located in the top surface 18 of the silicon layer 16, and the collected charge from the photogate 20a is transferred to the diffusion 23 by the transfer gate 20b resulting in a voltage change which can be optionally amplified within the unit cell and passed by a row address transistor to the column amplifier.

The unit cell circuits depicted in Figs. 1a, 1b and 2 provide simultaneous or sequential readout of the thermal and visible/NIR detectors. Charge generated by the visible/NIR radiation is collected under the photogate 20a for the desired integration time, typically at video rates of 30 milliseconds or 60 milliseconds. After integration the charge is transferred to known types of external circuits for amplification, column readout, and serial multiplexing.

In the CMOS embodiment of FIG. 2 charge is transferred onto a CMOS amplifier within the unit cell (not shown) or to a column amplifier (not shown), such as a capacitive transimpedance amplifier (CTIA). A low noise readout is obtained in this embodiment by several techniques. First, KTC noise is cancelled at the column by alternately reading the output amplifier after applying a reset signal, and before and after the photointegrated charge is transferred. Second, this embodiment makes use of low noise MOSFETs, buried channel FETS, and, where desired, JFETs, all constructed using conventional fabrication techniques.

FIGS. 3, 4a and 4b illustrate optical enhancements to the imagers 10 and 10' of FIGS. 1 and 2, the optical enhancements being compatible with the low noise operation of these imagers. The enhancements enable collection of the majority of the photogenerated charge (i.e., photogenerated electrons (PE)) to be collected under the photogate 20a (visible sensor) or thermal radiation by the element 22 (IR sensor). In FIG. 3 a microlens array 30, fabricated on a separate transparent substrate 32, is aligned to the imager chip and spaced apart from same by spacers 34 (such as indium columns). The microlens array 30 provides optical gain, focusing the incident radiation simultaneously on both the silicon layer 16 (visible focus (VF)) and the thermally isolated element 22 (IR focus (IRF)). An analysis suggests that the use of the microlens array 30 to implement an F2 system can enable gains in excess of four. The selection of material for the substrate 32 is important in order to attain a high transmission in both the visible and IR bands. Suitable materials for this purpose include, but are not limited to, ZnSe, ZnS, and CaF. It should be noted that the substrate 32 may actually be an entrance window of an enclosure or housing that contains the imager 10 or 10', along with related components, such as a thermoelectric (TE) cooler.

It is also within the scope of this invention to form the microlens array 30 within the radiation receiving surface of the silicon layer 16, such as by photolithographically defining and then etching diffractive binary lens elements into the surface.

In the embodiment of FIG. 4a a reflective microlens array, formed on a dielectric substrate, is positioned over the top surface of the imager. In the embodiment shown, dielectric or metallic spacers (such as Indium) are formed on the substrate to allow precise positioning of, and attachment of, the microlens array with respect to the isolated sensing elements, as well as to provide support for the entire thermal imaging chip. The reflector is shaped for concentrating any IR radiation passing through or around a sensing element back onto the sensing element.

Alternately, and as is illustrated in FIG. 4b, positioning may be accomplished through registration of the substrate containing the microreflectors, with respect to the thermal sensor chip, and the simultaneous use of this structure as a vacuum lid over the top of the thermal sensor chip assembly.

Figure 6A:
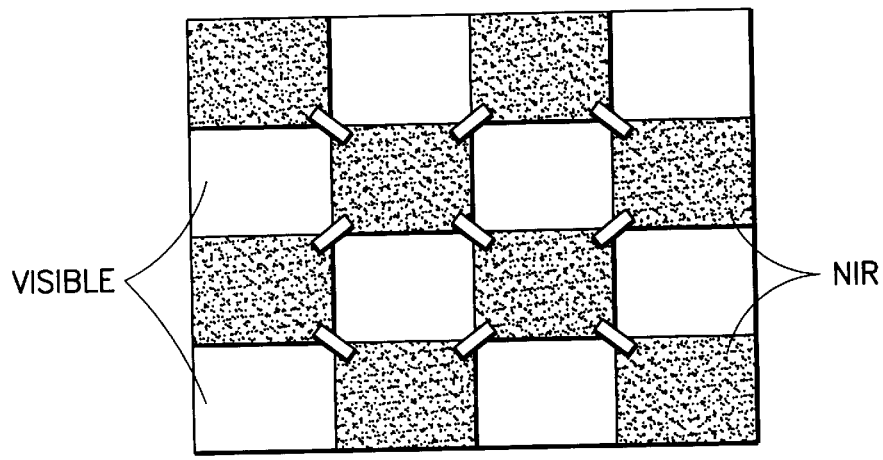
FIGS. 6a and 6b are plane and cross-sectional views, respectively, of the apertured LWIR/Visible/NIR imager of FIG. 5.
Figure 6B:
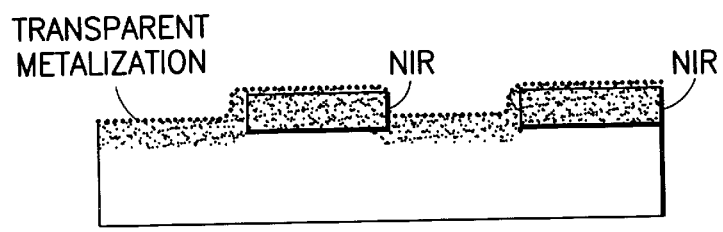

An imager that is responsive to three separate bands of wavelengths, or "colors", can also be realized by the teachings of this invention. As is shown in FIG. 5, the backside, radiation-receiving surface of the imager is provided with a plurality of NIR absorbing layers 12 that are atomically bonded at heterojunction atomic bonding interfaces 14 to the silicon layer 16. As is shown in FIGS. 6a and 6b, when viewed from the radiation receiving surface (FIG. 6a) the imager is seen as a checkerboard or strip pattern, with the LWIR/NIR-responsive unit cells alternating in a row/column manner with LWIR/VIS responsive unit cells. The NIR absorbing layer is selectively etched off the backside surface exposing the visible detection layer. Backside contact to both layers is made at the edges of the chip in the case of continuous rows (or columns), or through the deposition of a thin transparent conducting layer such as In-Sn oxide. In those regions where the NIR absorbing layer 12 has been removed, such as by etching, the electric field lines sweep out charge generated only by the visible radiation, while in the regions where the NIR absorbing layer is present the photogenerated carriers from NIR and visible radiation are collected. By subtracting the two the NIR and visible components of the image can be separated.

More particularly, charge carriers generated in the NIR (and visible) absorbing layers 12 are transported across the interface 14 and into the silicon layer 16 where they are collected beneath suitably biased photogates 20a. Those unit cells that do not include the NIR layer 12 admit visible light directly into the silicon layer 16. The charge carriers beneath the associated photogates 20a thus include photoelectrons that are generated within the In silicon layer 20 by the absorption of the visible light. The longer wavelength IR passes through the NIR layers 12 and the silicon layer 16, and may be focussed and detected as was described above with reference to FIG. 4. In this manner the NIR and visible components, with a LWIR (or MWIR) radiation component, can be spatially segregated and separately detected by the imager. By subtracting, within the unit cell or external to the unit cell, the signal generated at the centrally disposed unit cell of FIG. 5 (i.e., unit cell B) from the signals obtained at the adjacent unit cells (i.e., unit cells A and C), the contribution of the visible radiation induced charge carriers can be removed, leaving only the contribution from the NIR radiation induced charge carriers.

Figure 7:
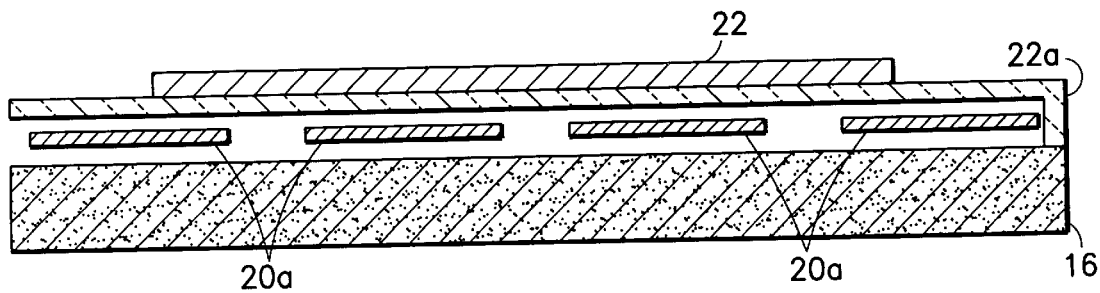
FIG. 7 is an enlarged, cross-sectional view of a three color NWIR or LWIR/Visible/NIR imager having a 4:1 difference in resolution between the visible/NIR detectors and the MWIR or LWIR detector.

Alternative architectures, such as the one shown in FIG. 7, improve the resolution in the visible, and provides multiple CCD pixels which collect electrons generated by visible radiation located within the extent of one larger pixel which responds to LWIR (or MWIR) radiation. This enables registration with but does not require oversampling of the LWIR signal. For example, pixel sizes of the CCD may be as small as nine microns (center to center), whereas the LWIR blur size for 10 micron radiation with F1 optics is approximately 24 microns. In FIG. 7 a 4:1 ratio is shown, e.g., the CCD cell size is nine microns while the LWIR pixel size is 36 microns. Other ratios can be employed as desired.

The foregoing teachings enable unit cell dimensions approaching or exceeding 25 microns, and performance parameters approaching 10 mK NEDT (LWIR); and near single photon detection in the visible and NIR.

The single chip imager described above can be packaged in a low cost integrated vacuum housing and, as was also described above, a window of the housing may also provide pixel-based optical concentration, such as is shown in FIG. 3. Low cost temperature stabilization and cooling can be achieved using a single stage thermoelectric cooler operating from 250K to 300K. Imager formats exceeding 1000× 1000 unit cells can be employed. Furthermore, and as was illustrated in FIG. 4b, a portion of the package can also be employed to support microreflectors.

In general, the construction of the imager 10 includes the doping of the silicon layer 16 and the doping and grading of the detecting layer 12 to facilitate charge transfer between these two layers at low illumination levels. The construction further includes the thinning of the silicon CCD layer 16, the bonding to the detecting layer 12 (in a hydrogen environment), and the final processing of the composite structure which can include photolithography and the etching of contacts, metallization, etc.

Figure 8:
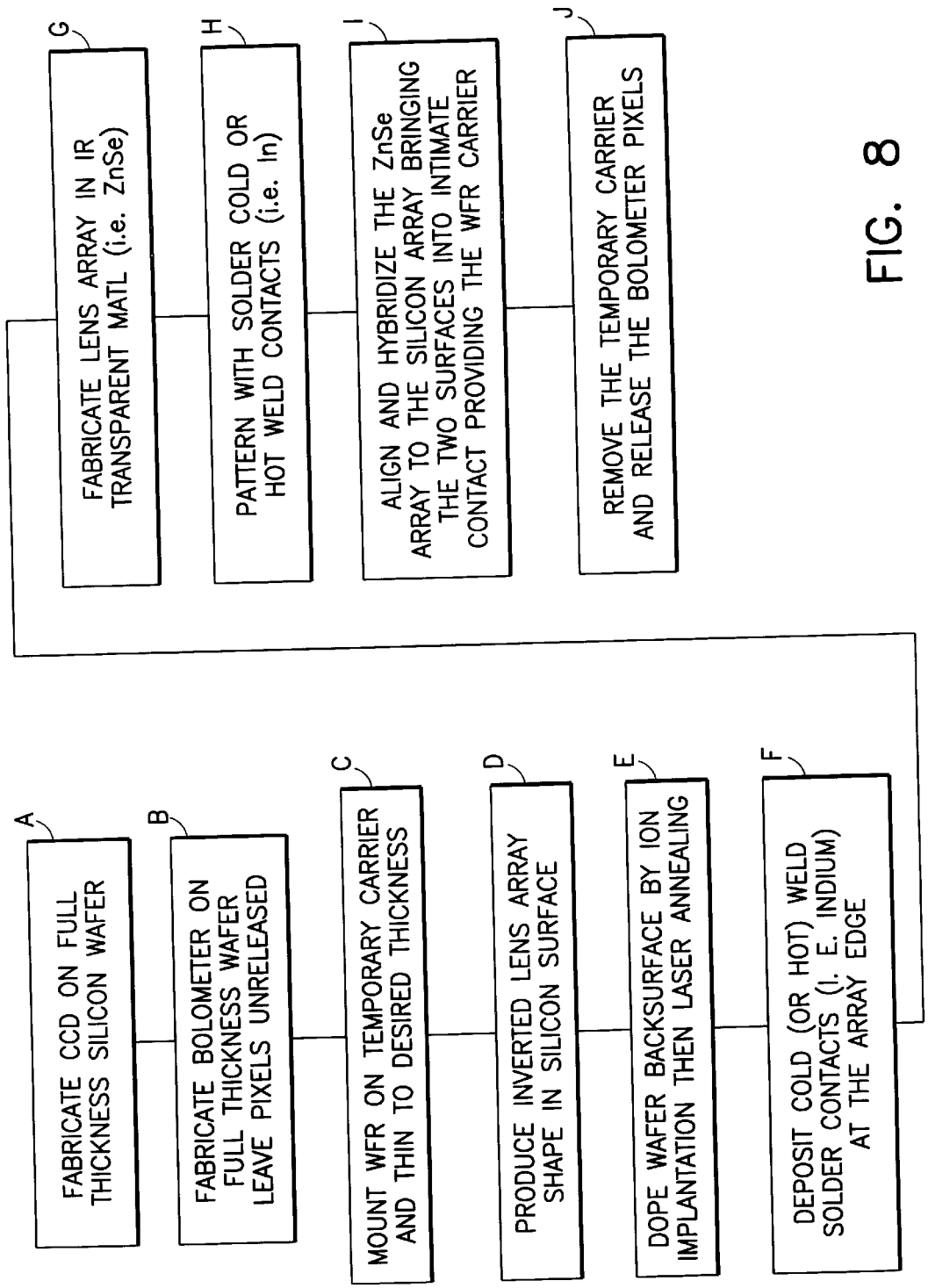
FIGS. 8 and 9 are process flow diagrams that illustrate fabrication techniques for non-NIR and NIR responsive visible/LWIR sensor arrays, respectively.

More particularly, FIG. 8 is a process flow diagram illustrating a method for fabricating a monolithic visible/LWIR bolometer sensor, without NIR capability. This method includes the following steps. Step A: fabricate in a wafer (e.g., a standard Si 4" or 6" wafer) the CCD (or CMOS) readout circuits and gate structures using conventional metal, polysilicon and oxide layers and implantation. Step B: fabricate the bolometer on the full thickness wafer, leaving the pixels unreleased. Step C: mount the wafer front (WFR) surface on a temporary carrier and thin to a desired thickness. Step D: produce an inverted lens array shape in the silicon surface. Step E: dope the wafer back-surface by ion implantation and low temperature annealing. Step F: deposit cold (or hot) weld solder contacts (i.e. Indium) at the array edge. Step G: fabricate the lens array in IR transparent material (i.e. ZnSe). Step H: pattern the lens array with solder cold or hot weld contacts (i.e. Indium). Step I: align and hybridize the ZnSe lens array to the silicon array, bringing the two surfaces into intimate contact and thus providing the wfr carrier. Step J: the temporary carrier is removed, and the bolometer pixels are released (i.e., etching out the support structure such that the bolometer, resting on the thin nitride layer (bridge 29a) is supported by the (two) bridge legs 29b).

Figure 9:
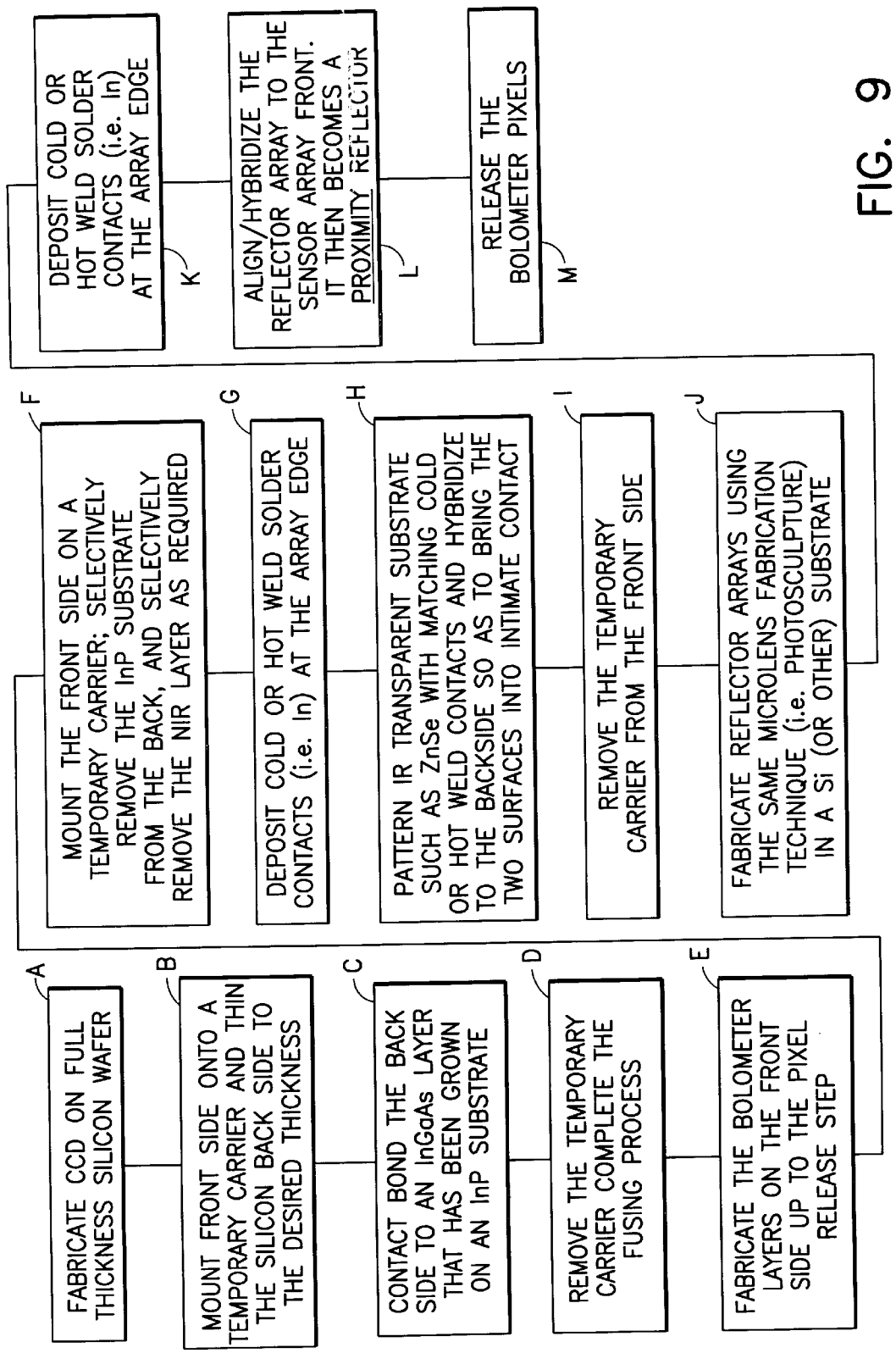

FIG. 9 is a process flow diagram illustrating a method for fabricating a monolithic visible/LWIR sensor (employing ZnSe), with NIR capability. This method includes the following steps. Step A: fabricate the CCD or CMOS readout circuits on a full thickness silicon wafer. Step B: mount the front side of the wafer onto a temporary carrier and thin the silicon back side to the desired thickness. Step C: contact bond the back side of the wafer to an InGaAs layer that has been grown on an InP substrate. Step D: remove the temporary carrier and complete the wafer fusing process. Step E: fabricate the bolometer layers on the front side, up to the pixel release step. Step F: mount the front side onto a temporary carrier; selectively remove the InP substrate from the back side, and selectively remove the NIR layer as required (see, for example FIGS. 6a and 6b. Step G: deposit cold or hot weld solder contacts (i.e. Indium) at the array edge. Step H: pattern an IR transparent substrate, such as ZnSe, with matching cold or hot weld contacts and hybridize to the back side so as to bring the two surfaces into intimate contact. Step I: remove the temporary carrier from the front side. Step J: fabricate one or more reflector arrays using the same microlens fabrication technique (i.e. photosculpture) in a Si (or other) substrate. Step K: deposit cold or hot weld solder contacts (i.e. Indium) at the edge of the reflector array. Step L: align/hybridize the reflector array to the sensor array front, thereby providing a proximity reflector. Step M: release the bolometer pixels.

In the foregoing methods the thinned silicon layer 16 is bonded to the detecting layer 12 in an $H_2$ or Hg atmosphere (or in vacuum) by the application of pressure at a temperature greater than >400 C to effect chemical bonding. A $H_2$ atmosphere may be desirable for use when bonding an InGaAs layer 12 to the silicon layer 16.

It should be noted that by adjusting the magnitude of electric fields across the imager 10 by means of photogate bias potentials (it being assumed that a transparent backside contact is provided), the imager 10 may be operated as an Avalanche Photodiode Imager (API) wherein amplification of the charge carrier signal is achieved through avalanche multiplication. An electric field strength in excess of 200 kV/cm is believed to be adequate to achieve the avalanche multiplication effect in the silicon layer 16.

By generating electrons and holes in the narrow bandgap material (e.g., the atomically bonded layer 12 of Group II–VI or Group III–V material) and then collecting the electrons in the wider bandgap silicon (p-silicon) layer 16, a low noise avalanche gain (excess noise factor, F<4) can thus be achieved.

Although described above with respect to specific semiconductor material types and thicknesses, it should be realized that these are to be viewed as exemplary and not in a limiting sense. For example, Group IV materials such as germanium or germanium/silicon alloys, and Group IV–VI materials such as Pb-salt semiconductors, e.g., PbSe, PbS, PbTe, etc., can also be employed.

Furthermore, certain of the steps depicted in FIGS. 8 and 9 could be performed in other than the order shown while still achieving the same result.

Thus, while the invention has been particularly shown and described with respect to a preferred embodiment thereof, it will be understood by those skilled in the art that changes in form and details may be made therein without departing from the scope and spirit of the invention.

What is claimed is:

1. An imaging device having a plurality of unit cells that contribute to forming an image of a scene, said imaging device comprising a layer of wide bandgap semiconductor material having photogate charge-mode readout circuitry disposed upon a first surface of said layer, a second, opposing surface of said layer being bonded at a heterojunction interface to a surface of a layer of narrower bandgap semiconductor material selected for absorbing electromagnetic radiation having wavelengths longer than about one micrometer and for generating charge carriers, the generated charge carriers being transported across said heterojunction interface for collection by said photogate charge-mode readout circuitry, and further comprising a thermal sensing element disposed above and thermally isolated from said first surface of said layer.

2. An imaging device as set forth in claim 1, wherein said layer of wide bandgap semiconductor material is comprised of silicon.

3. An imaging device as set forth in claim 1, wherein said layer of narrower bandgap semiconductor material is comprised of a Group III–V semiconductor material.

4. An imaging device as set forth in claim 1, wherein said layer of narrower bandgap semiconductor material is comprised of a Group II–VI semiconductor material.

5. An imaging device as set forth in claim 1, wherein said layer of narrower bandgap semiconductor material is comprised of a Group IV material or a Group IV–VI material.

6. An imaging device as set forth in claim 1, wherein said layer of narrower bandgap material is disposed upon a surface of a transparent substrate.

7. An imaging device as set forth in claim 1, and further comprising means for establishing an electric field at least through said first layer for facilitating the collection of said charge carriers by said photogate charge-mode readout circuitry.

8. An imaging device as set forth in claim 1, and further comprising means for establishing an electric field at least through said first layer for amplifying said charge carriers within said first layer by avalanche multiplication.

9. An imaging device as set forth in claim 1, and further comprising a plurality of thermal reflectors individual ones of which are disposed for concentrating incident thermal radiation onto said thermal sensing element.

10. An imaging device as set forth in claim 1, wherein said thermal sensing element is comprised of one of a bolometer element, a pyroelectric element, or a thermopile element.

11. An imaging device as set forth in claim 1, wherein said layer of narrower bandgap semiconductor material is continuous across said second surface.

12. An imaging device as set forth in claim 1, wherein said layer of narrower bandgap semiconductor material has a plurality of apertures formed therein in registration with selected ones of said unit cells for admitting electromagnetic radiation, having wavelengths less than about one micrometer, into said selected ones of said unit cells.

13. An imaging device as set forth in claim 1, wherein said photogate charge-mode readout circuitry is comprised of charged coupled device (CCD) readout circuitry.

14. An imaging device as set forth in claim 1, wherein said photogate charge-mode readout circuitry is comprised of complementary metal oxide semiconductor (CMOS) readout circuitry.

15. An imaging device having a plurality of unit cells that contribute to forming an image of a scene, said imaging device comprising a layer of semiconductor material having photogate charge-mode readout circuitry disposed upon a first surface of said layer, a second, opposing surface of said layer being a radiation admitting surface of said layer, said layer having a bandgap selected for absorbing electromagnetic radiation having wavelengths shorter than about one micrometer and for generating charge carriers, the generated charge carriers being collected by said photogate charge-mode readout circuitry, and further comprising a thermal sensing element disposed above and thermally isolated from said first surface of said layer.

16. An imaging device as set forth in claim 15, wherein said layer of semiconductor material is comprised of silicon.

17. An imaging device as set forth in claim 15, and further comprising means for establishing an electric field through said first layer for facilitating the collection of said charge carriers by said photogate charge-mode readout circuitry.

18. An imaging device as set forth in claim 15, and further comprising means for establishing an electric field at least through said first layer for amplifying said charge carriers within said first layer by avalanche multiplication.

19. An imaging device as set forth in claim 15, and further comprising a plurality of thermal reflectors individual ones of which are disposed for concentrating incident thermal radiation onto said thermal sensing element.

20. An imaging device as set forth in claim 15, wherein said thermal sensing element is comprised of one of a bolometer element, a pyroelectric element, or a thermopile element.

21. An imaging device as set forth in claim 15, and further comprising an array of microlenses that are disposed relative to said radiation admitting surface for focussing onto said layer electromagnetic radiation having wavelengths shorter than about one micrometer, and for focussing onto said thermal sensing element electromagnetic radiation having wavelengths longer than about one micrometer.

22. An imaging device as set forth in claim 15, wherein said photogate charge-mode readout circuitry is comprised of charged coupled device (CCD) readout circuitry.

23. An imaging device as set forth in claim 15, wherein said photogate charge-mode readout circuitry is comprised of complementary metal oxide semiconductor (CMOS) readout circuitry.

24. An imaging device as set forth in claim 15, and further comprising a layer of narrower bandgap semiconductor material that is atomically bonded to said second surface along a heterojunction interface that is continuous across said second surface.

25. An imaging device as set forth in claim 15, and further comprising a layer of narrower bandgap semiconductor material that is atomically bonded to said second surface along a heterojunction interface, said layer of narrower bandgap semiconductor material having a plurality of apertures formed therein in registration with selected ones of said unit cells for admitting electromagnetic radiation, having wavelengths less than about one micrometer, into said selected ones of said unit cells.

26. An imaging device as set forth in claim 25, and further comprising means for subtracting an electrical signal generated by the selected ones of the unit cells from electrical signals generated by adjacent, non-selected ones of the unit cells.

27. An imaging device having a plurality of unit cells that contribute to forming an image of a scene, said imaging device comprising a layer of wide bandgap semiconductor material having readout circuitry employing a photodiode for charge collection, said readout circuitry being disposed upon a first surface of said layer, a second, opposing surface of said layer being bonded at a heterojunction interface to a surface of a layer of narrower bandgap semiconductor material selected for absorbing electromagnetic radiation having wavelengths longer than about one micrometer and for generating charge carriers, the generated charge carriers being transported across said heterojunction interface for collection by said photodiode readout circuitry, and further comprising a thermal sensing element disposed above and thermally isolated from said first surface of said layer.

28. An imaging device having a plurality of unit cells that contribute to forming an image of a scene, said imaging device comprising a layer of semiconductor material having readout circuitry employing a photodiode for charge collection, said readout circuitry being disposed upon a first surface of said layer, a second, opposing surface of said layer being a radiation admitting surface of said layer, said layer having a bandgap selected for absorbing electromagnetic radiation having wavelengths shorter than about one micrometer and for generating charge carriers, the generated charge carriers being collected by said photodiode readout circuitry, and further comprising a thermal sensing element disposed above and thermally isolated from said first surface of said layer.

29. A monolithic mid wave IR (MWIR) or long wave IR (LWIR)/visible/NIR sensor array, comprising:

a substrate having an atomically bonded, narrower bandgap layer on a first, radiation-receiving surface; and a plurality of detector sites disposed on a second, opposite surface of said substrate, each of said sites comprising, readout circuitry;

a MWIR or LWIR-responsive detector disposed over said second surface of said substrate; and a plurality of visible/NIR detectors corresponding to each detector site, said plurality of visible/NIR detectors being interposed between said MWIR or LWIR-responsive detector and said second surface.

* * * * *